(12) United States Patent
Tekletsadik et al.

(10) Patent No.: US 7,799,999 B2
(45) Date of Patent: Sep. 21, 2010

(54) INSULATED CONDUCTING DEVICE WITH MULTIPLE INSULATION SEGMENTS

(75) Inventors: Kasegn D. Tekletsadik, Rexford, NY (US); Steve Krause, Ipswich, MA (US); Eric Hermanson, Georgetown, MA (US); Russell J. Low, Rowley, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 167 days.

(21) Appl. No.: 11/841,086

(22) Filed: Aug. 20, 2007

(65) Prior Publication Data

US 2009/0050347 A1    Feb. 26, 2009

(51) Int. Cl.
*H01B 7/00*    (2006.01)

(52) U.S. Cl. .................................... 174/111; 174/115
(58) Field of Classification Search ............... 174/73.1, 174/111, 115
See application file for complete search history.

(56) References Cited

U.S. PATENT DOCUMENTS

| 3,209,345 A | * | 9/1965 | Litte ........................... 341/15 |
| 5,569,974 A |   | 10/1996 | Morikawa et al. |
| 5,744,812 A |   | 4/1998 | Oh et al. |
| 6,653,642 B2 |   | 11/2003 | Pedersen et al. |

* cited by examiner

*Primary Examiner*—Chau N Nguyen (57) ABSTRACT

Insulated conducting devices and related methods are disclosed. An insulated conducting device for a voltage structure comprises: a conductor connected to a voltage; and multiple insulation segments enclosing the conductor, the multiple insulation segments interfacing with one another.

22 Claims, 7 Drawing Sheets

INSULATED CONDUCTING DEVICE WITH MULTIPLE INSULATION SEGMENTS

BACKGROUND

1. Technical Field

The disclosure relates generally to electric field stress shielding, and more particularly, to an insulated conducting device for electrically shielding a structure at a voltage.

2. Background Art

Ion implantation is a standard technique for introducing conductivity altering impurities into, or doping, semiconductor wafers. A typical ion implantation process uses an energetic ion beam to introduce impurities (ions) into semiconductor wafers. During ion implantation, a source feed material is energized to generate an ion beam, and the generated ion beam needs to be accelerated by an acceleration column at a high voltage, for example, 670 kV. A voltage structure (usually referred to as a terminal) is used to provide the high voltage.

Figure 1:
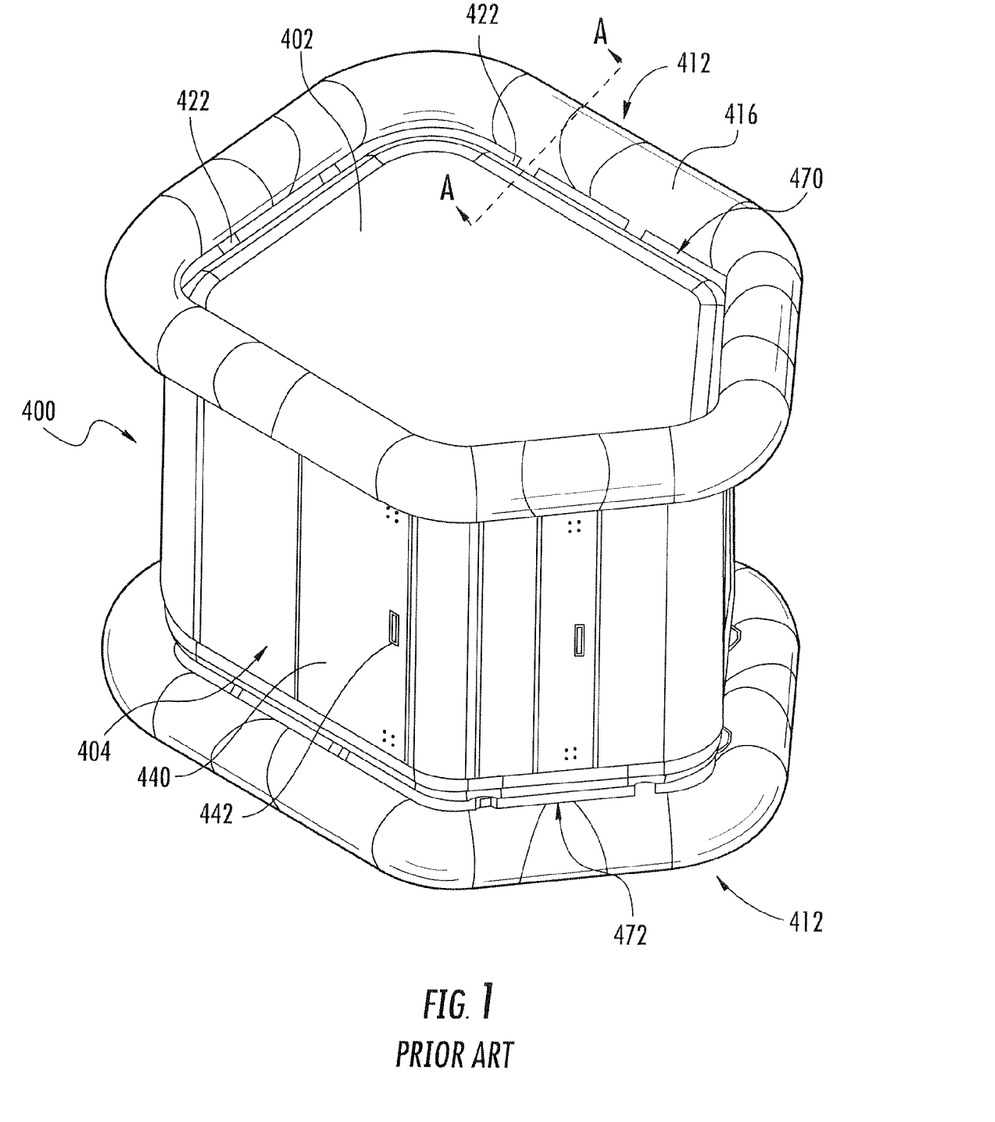
FIG. 1 shows an insulated conductor according to prior art.

A co-pending U.S. patent application Ser. No 11/527,842 filed on Sep. 27, 2006 discloses an insulated conductor used as an electrical stress shield for a voltage structure in an ion implantation device, which is herein incorporated by reference. FIG. 1 shows a perspective view of a voltage structure 400 disclosed in Ser. No. 11/527,842. Referring to FIG. 1, voltage structure 400 may include a base, one or more upstanding sidewalls 404 coupled to the base, and a top 402 coupled to the one or more upstanding sidewalls 404. One upstanding sidewall 404 may have a door 440 with a handle 442 to provide personnel access to the internal cavity of voltage structure 400. Voltage structure 400 may have one upstanding sidewall 404 manufactured of one solid material piece or any plurality of separate pieces. Although illustrated as a solid piece, top 402 of voltage structure 400 may also be fabricated of a plurality of spaced conductors forming a type of conductor mesh to allow air to flow through the openings of the mesh.

One or more insulated conductors 412 may be disposed about portions of the exterior surface of voltage structure 400 that have excess electric stress. In FIG. 1, a top insulated conductor 412 is disposed proximate the entire periphery of a top edge 470 of voltage structure 400, and a bottom insulated conductor 412 is disposed proximate the entire periphery of a bottom edge 472. Although top and bottom insulated conductors 412 are positioned about an entirety of the periphery of the respective edges 470, 472, alternative embodiments may have additional or alternative exterior portions where insulated conductors 412 may be positioned. These portions may include, but not be limited to, horizontal edges, vertical edges, corners, and openings or interfaces where voltage structure 400 interfaces with external parts. Some external parts may include a motor, a generator, or a utility interface. In one example, a sphere shaped insulated conductor may be positioned about a corner of voltage structure 400. Insulated conductor 412 may include an insulator 416 with a dielectric strength greater than, for example, 75 kV/inch.

A plurality of brackets 422 may be coupled to voltage structure 400 and associated insulated conductors 412 to support insulated conductors 412 proximate an exterior portion of voltage structure 400. Brackets 422 may have a length to enable insulated conductors 412 to be positioned a desired distance from voltage structure 400. The desired distance may range from almost zero (nearly touching) to a maximum distance permitted by the surrounding air gap. In one embodiment, the desired distance is at least 1.5 inches. Bracket(s) 422 may be fabricated of either conductive or nonconductive material. Bracket 422 may also function as an electrical connection between voltage structure 400 and insulated conductor 412.

As shown in FIG. 1, insulated conductor 412 and insulator 416 are single continuous closed structures. The large size of a single piece insulator 416 may have problems in manufacturing, installing, maintenance, cost, and reliability.

SUMMARY

A first aspect of the disclosure provides an insulated conducting device for a voltage structure, the insulated conducting device comprising: a conductor connected to a voltage; and multiple insulation segments enclosing the conductor, the multiple insulation segments interfacing with one another.

A second aspect of the disclosure provides an insulated conducting device for a voltage structure, the insulated conducting device comprising: multiple segments interfacing with one another, each of which includes a conductor enclosed by an insulation portion; wherein the conductor includes multiple conductor cables, one of which is connected to the voltage structure.

A third aspect of the disclosure provides a method of electrically shielding a voltage structure, the method comprising: providing multiple segments, each segment including a conductor encapsulated by a dielectric material; connecting each conductor to the voltage structure; and positioning the multiple segments such that two immediately adjacent conductors are in proximity such that an equi-potential line of the two immediately adjacent conductors is substantially similar to that of a continuous conductor.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 2:
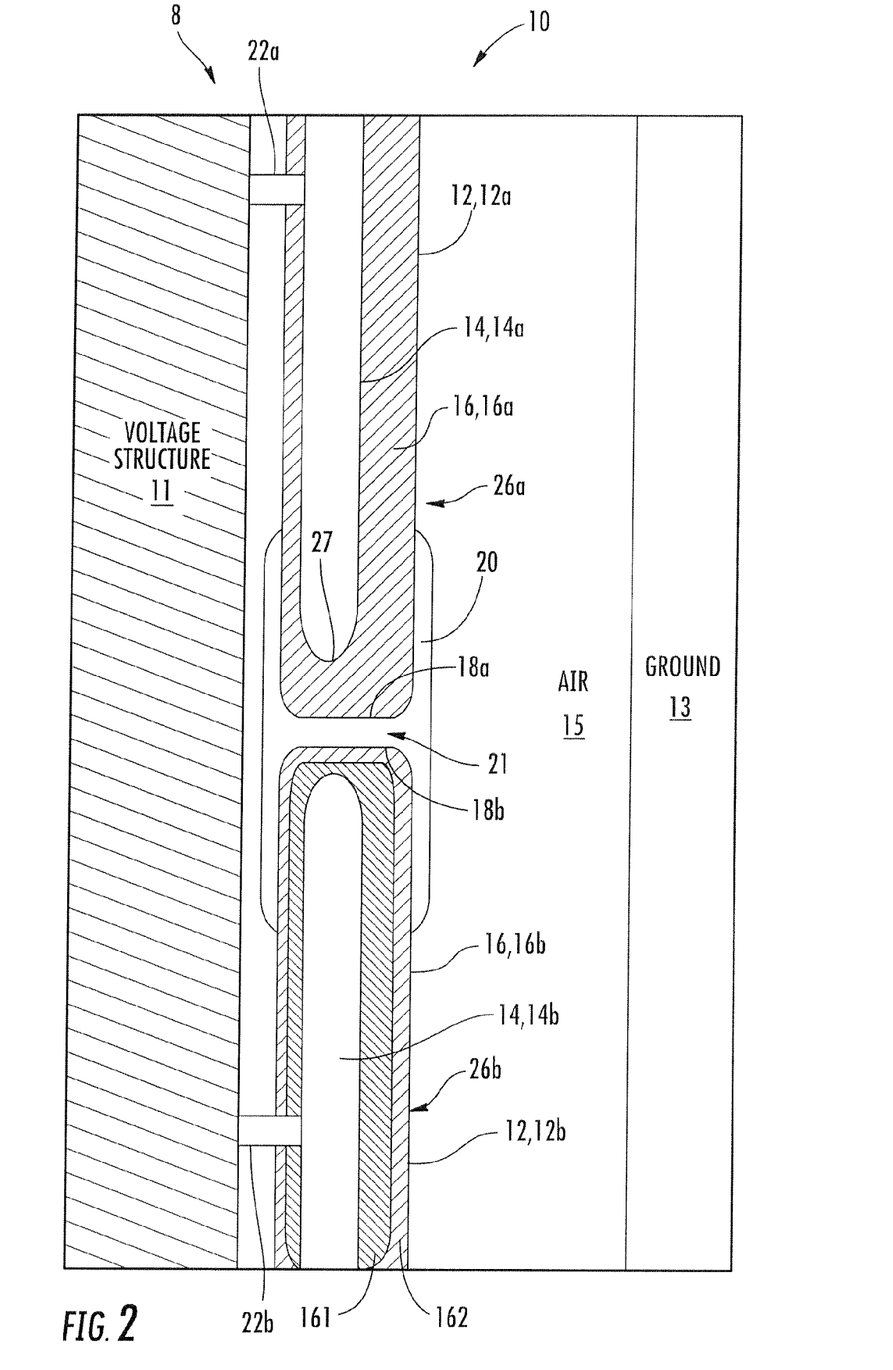
FIG. 2 shows an embodiment of an insulated conducting device.

Referring to the drawings, FIG. 2 shows schematically one embodiment of an insulated conducting device 10. As shown in FIG. 2, a system 8 includes a voltage structure 11 and an insulated conducting device 10. Insulated conducting device 10 is positioned between voltage structure 11 and a ground 13, e.g., a metallic structure. And the gap between insulated conducting device 10 and ground 13 is filled with air 15. Insulated conducting device 10 includes multiple segments 12 (12a, 12b shown for illustration) each including a conductor segment 14 (14a, 14b shown) and an insulation segment 16 (16a, 16b shown), respectively. Insulation segment 16 may be made of dielectric materials such as, for example, Chlorinated Poly Vinyl Chloride (CPVC), syntactic silicone foam, epoxy resin. As shown in segment 12b only, insulation segment 16 (16b) may include multiple layers 161, 162 of different materials to control the radial stress inside insulation segment 16 and in air 15 surrounding insulation segment 16. Conductor segment 14 is enclosed/encapsulated by a respective insulation segment 16.

Two immediately adjacent insulation segments 16a, 16b interface with one another. In the description herein, the term "interface" means that two insulation segments 16a, 16b are positioned close to one another, including, but is not limited to, that insulation segments 16a, 16b contact one another. According to an embodiment, an interface medium 20 may be applied between two interfacing insulation segments 16a, 16b to, inter alia, improve insulation strength in an interface area 21. According to an embodiment, interface medium 20 extends beyond interface area 21 and partially covers insulation segments 16a, 16b.

Although FIG. 2 shows that conductor segments 14a, 14b, are each connected separately to voltage structure 11 through respective connection vias 22a, 22b this is not necessary. For example, according to another embodiment, conductor segments 14a, 14b may be separately connected to a power supply different than voltage structure 11, provided that the potentials of conductor segments 14a, 14b are substantially equal. For example, conductor segments 14a, 14b may be connected to a different electrical potential, e.g., 500 kV, than voltage structure 11 at, e.g., 670 kV. At 500 kV, insulated conducting device 10 would still shield voltage structure 11, but the stress between ground 13 and insulated conducting device 10 would be reduced.

Figure 3:
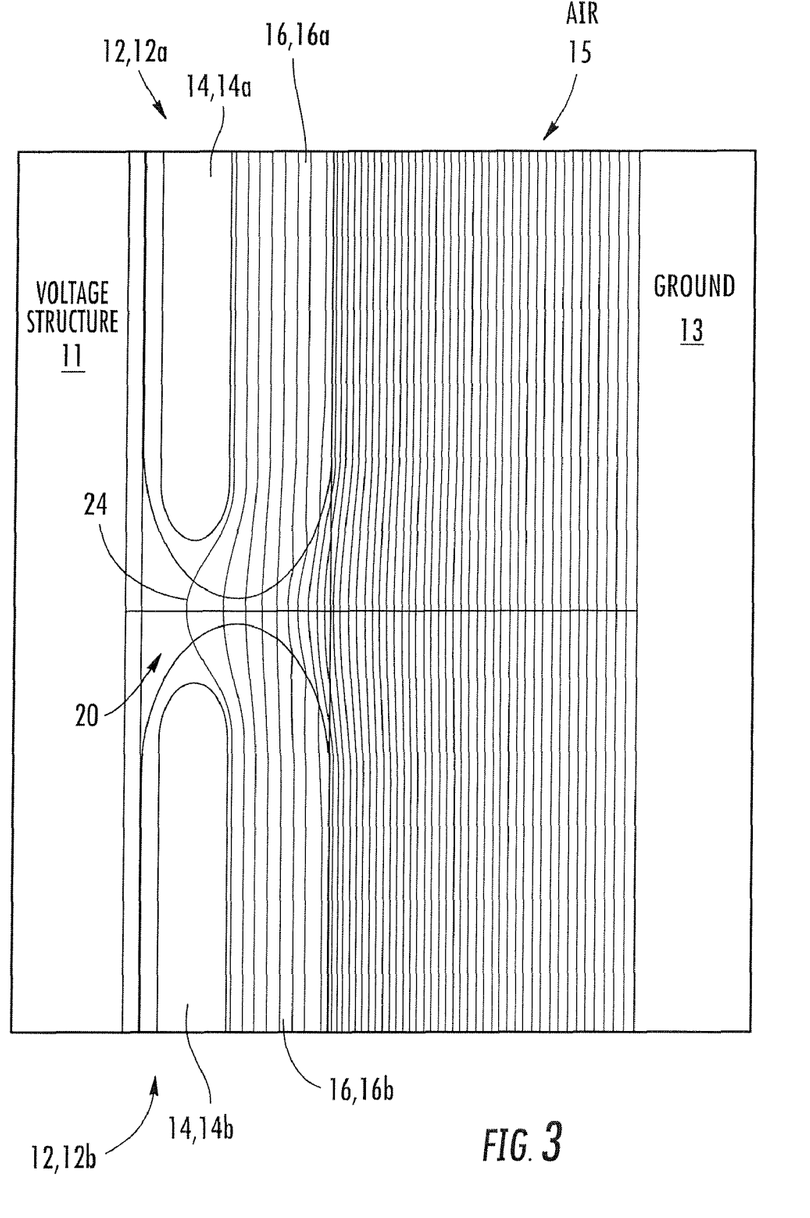
FIG. 3 shows equi-potential lines of the insulated conducting device of FIG. 2.

According to an embodiment, as shown in FIG. 3, conductor segments 14a, 14b are in close proximity such that an equi-potential line(s) 24 of conductor segments 14a, 14b are substantially similar to that of a continuous conductor, i.e., as if conductor segments 14a, 14b were an integrated single conductor. In addition, the equi-potential lines 24 allocate the electrical stress of voltage structure 11 mainly on the insulation material of insulation segments 16a, 16b and/or interface medium 20 instead of on air 15 around voltage structure 11. As a consequence, an electrical breakdown may be avoided. Details of the functions of insulated conducting device 10 are provided in Ser. No. 11/527,842.

According to an embodiment, as shown in FIG. 2, interface surfaces 18a, 18b of insulation segments 16a, 16b, respectively, are substantially perpendicular to an adjacent surface, e.g., 26a, 26b, respectively. An edge 27 of conductor segment 14 (shown in 14a only) is substantially rounded toward interface surface 18a.

Figure 4:
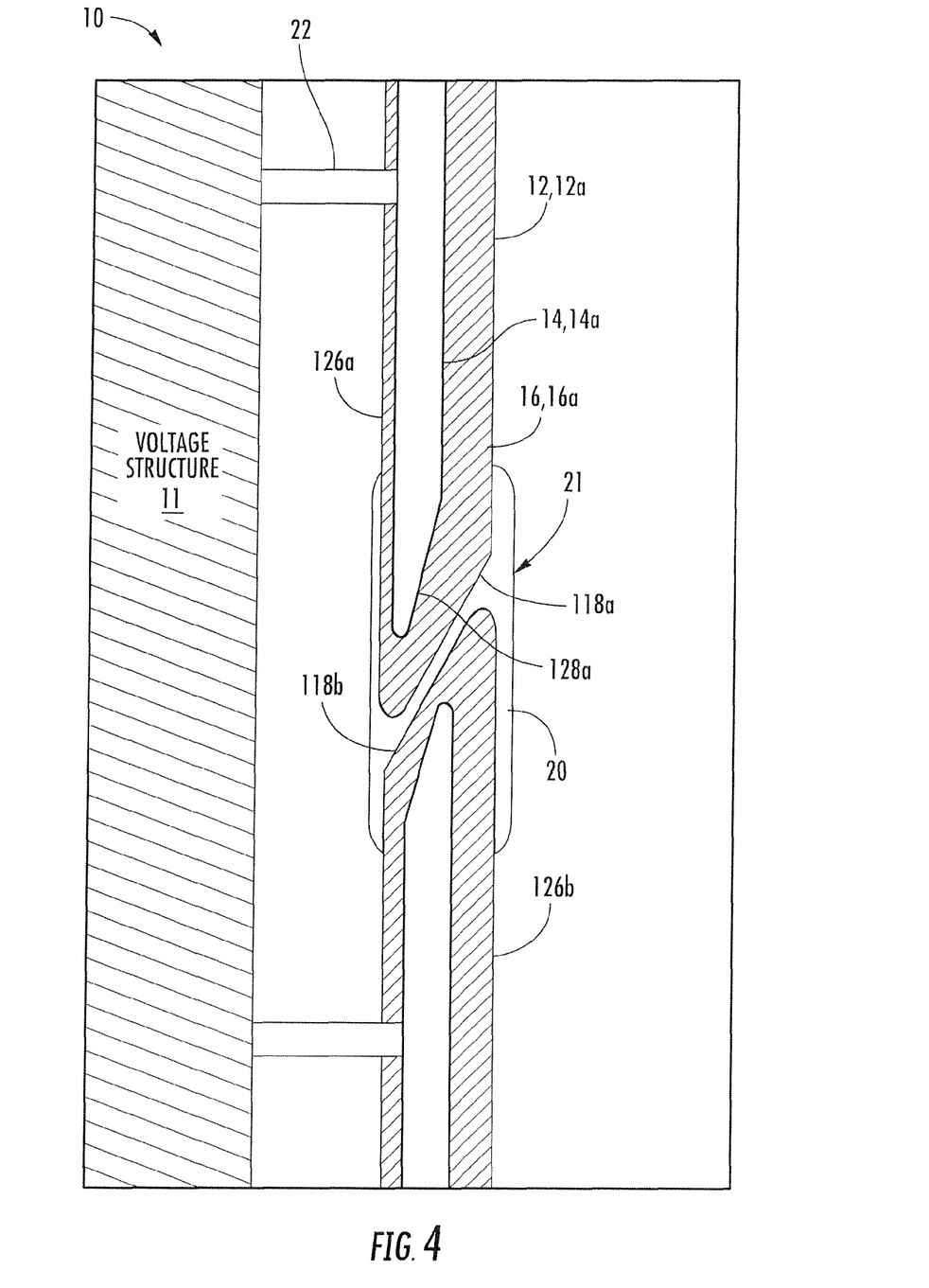
FIG. 4 shows another embodiment of an insulated conducting device.
Figure 5A:
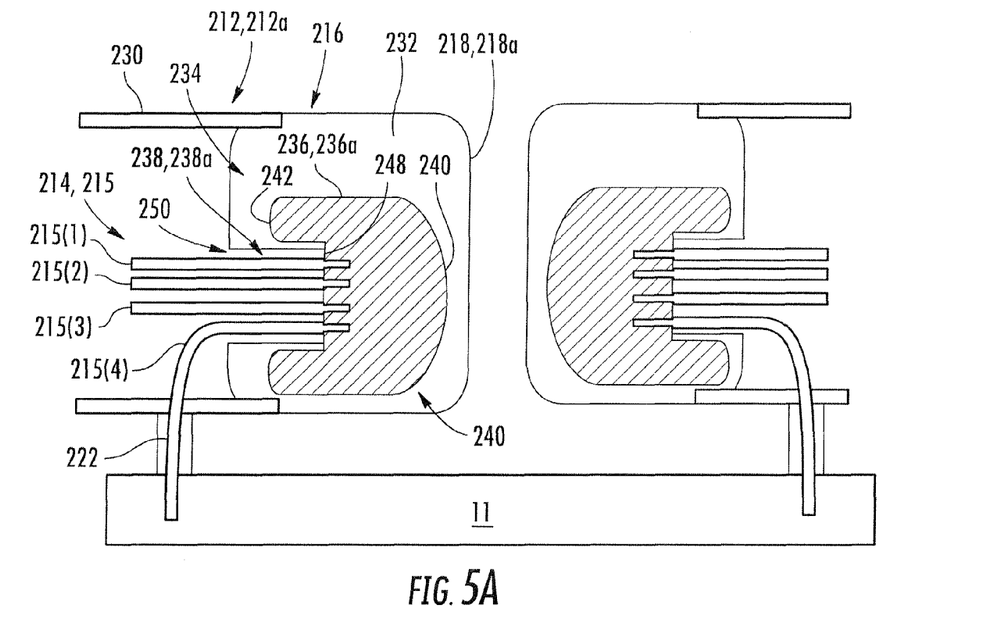
FIGS. 5A-5D show embodiments of an insulated conducting device with a group of cables.

According to an alternative embodiment, as shown in FIG. 4, an interface surface 118a or 118b is substantially sloped with respect to an adjacent surface 126a or 126b. In this case, interface surfaces 118a, 118b overlap one another. According to an embodiment, as shown in FIG. 4, an edge 128a of conductor segment 14a adjacent to interface surface 118a is also substantially sloped. Preferably, the sloped edge 128a matches the sloped interface surface 118a, i.e., edge 128a and interface surface 118a are sloped in similar angles. According to an embodiment, as shown in FIGS. 2 and 4, each conductor segment 14a, 14b may be a single hollow metal pipe (detail not shown). According to another embodiment, as shown in FIG. 5A, a conductor segment 214 may include a group of conductor cables 215. A conductor cable 215 refers to a cable, preferably a high voltage cable, which includes a center conductor encapsulated within an insulating material.

Figure 5B:
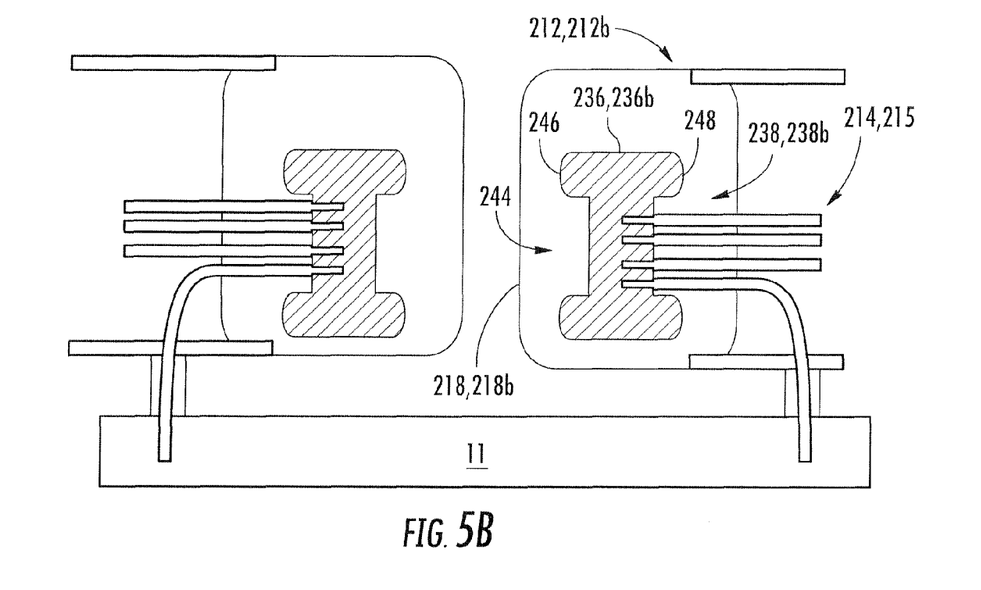

Referring to FIGS. 5A and 5B, collectively, segments 212 (212a, 212b shown for illustration in FIGS. 5A and 5B, respectively) each includes a conductor segment 214 including a group of conductor cables 215 (shown on left side of FIG. 5A only for clarity). According to an embodiment, the group of conductor cables 215 includes multiple conductor cables, for example four conductor cables 215(1), 215(2), 215(3), and 215(4). One of the four conductor cables 215, here conductor cable 215(4), is electrically connected to voltage structure 11 through connection via 222. Connection via 222 may be an integrated part of connector cable 215(4).

Conductor segment 214 may also include a shielding conductor portion 236 (236a, 236b shown for segments 212a, 212b, respectively) adjacent to interface surface 218 (218a, 218b shown). Shielding conductor portion 236 extends toward interface surface 218 further than the group of conductor cables 215. The group of cables 215 are electrically connected to shielding conductor portion 236 by extending into an opening 238 (238a, 238b shown) of shielding conductor portion 236.

According to an embodiment, shielding conductor portion 236 is substantially U-shaped, as shown by shielding conductor portion 236a in a cross-sectional view in FIG. 5A, with a connecting edge 240 of the U-shape facing interface surface 218a. Connecting edge 240 is rounded toward interface surface 218a. According to an embodiment, an end 242 adjacent to opening 238a of the U-shape is also rounded.

According to another embodiment, shielding conductor portion 236 is substantially H-shaped, as shown by shielding conductor portion 236b in a cross-sectional view in FIG. 5B, with an opening 244 of the H-shape facing interface surface 218b. An end 246 adjacent to opening 244 is rounded toward interface surface 218b. According to an embodiment, an end 248 adjacent to opening 238b of the H-shape is also rounded.

Other physical configurations of shielding conductor portion 236 are also possible and included.

Figure 5C:
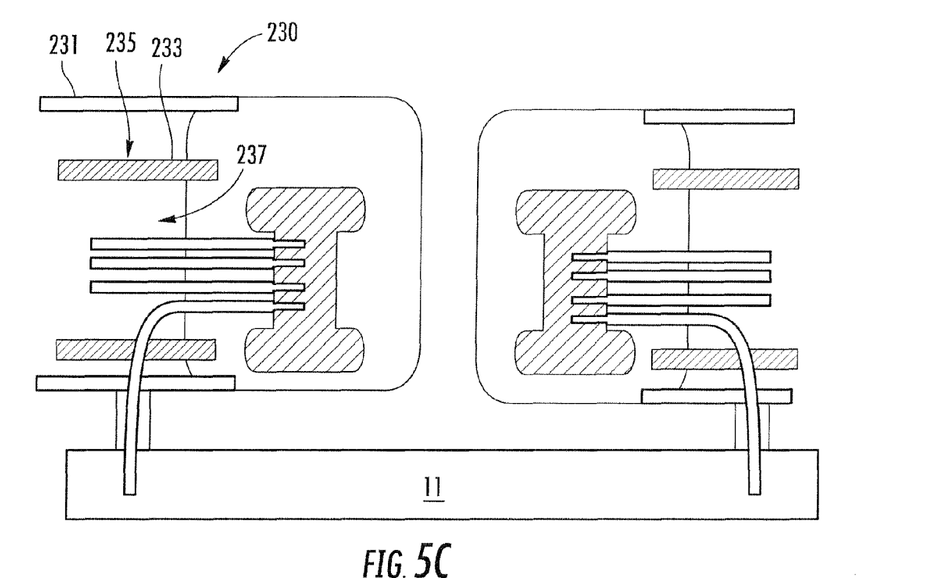

With continuing reference to FIGS. 5A and 5B, segment 212 may include an insulation segment 216 (shown only in FIG. 5A for brevity) which includes a pipe-shaped portion 230 and a connection mold portion 232. According to an embodiment, connection mold portion 232 may include interface surface 218. Pipe-shaped portion 230 may include a Chlorinated Poly Vinyl Chloride (CPVC) pipe. Pipe-shaped portion 230 may include a single pipe, as shown in FIGS. 5A and 5B, or may include multiple nested pipes 231, 233, as shown in FIG. 5C, to divide the insulation region into separate/different cavities 235, 237, where different cavities 235, 237 may further include different insulation materials (not shown).

Figure 5D:
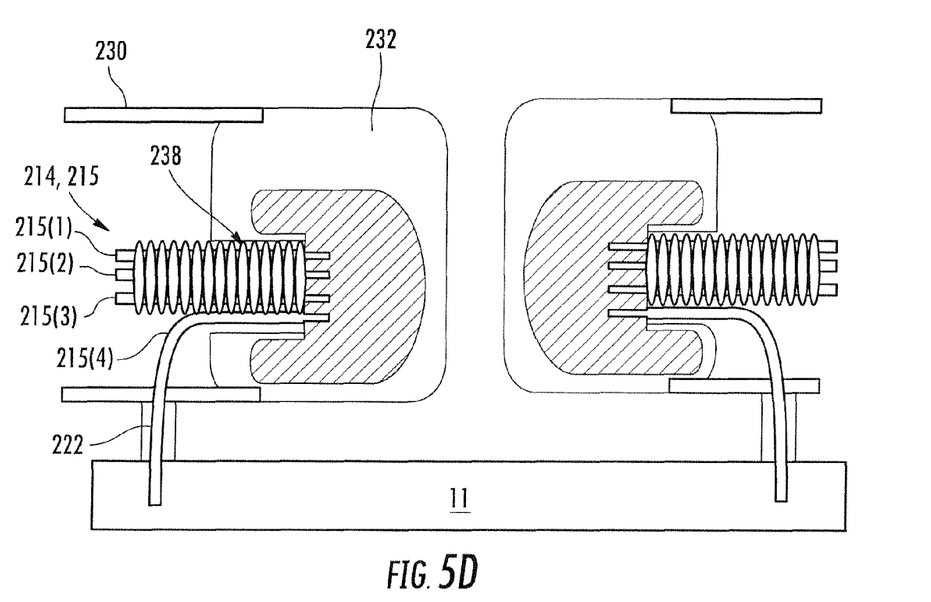

Conductor cables 215 may be substantially straight lines, as shown in FIGS. 5A and 5B, or may be coiled inside pipe-shaped portion 230, as shown in FIG. 5D, to further reduce the electrical stresses. In addition, two conductor cables 215 may be transposed with respect to the respective positions, e.g., may change the relation positions thereof, or may be twisted together inside pipe-shaped portion 230.

Returning to FIG. 5A, connection mold portion 232 is adjacent to interface surface 218 of segment 212. A portion 234 of connection mold portion 232 may be received by/extend into pipe-shaped portion 230 such that connection mold portion 232 and pipe-shaped portion 230 are coupled. Connection mold portion 232 substantially encapsulates shielding conductor portion 236 except a portion 248 thereof connected to cables 215. Connection mold portion 232 may be a substantially solid non-conductive material, e.g., epoxy resin (plastic).

According to an embodiment, preferably, as shown in FIG. 5A, connection mold portion 232 may include a hollow portion 250 which extends to portion 248 of shielding conductor portion 236. Group of conductor cables 215 may go through hollow portion 250 to connect to shielding conductor portion 236.

Figure 6:
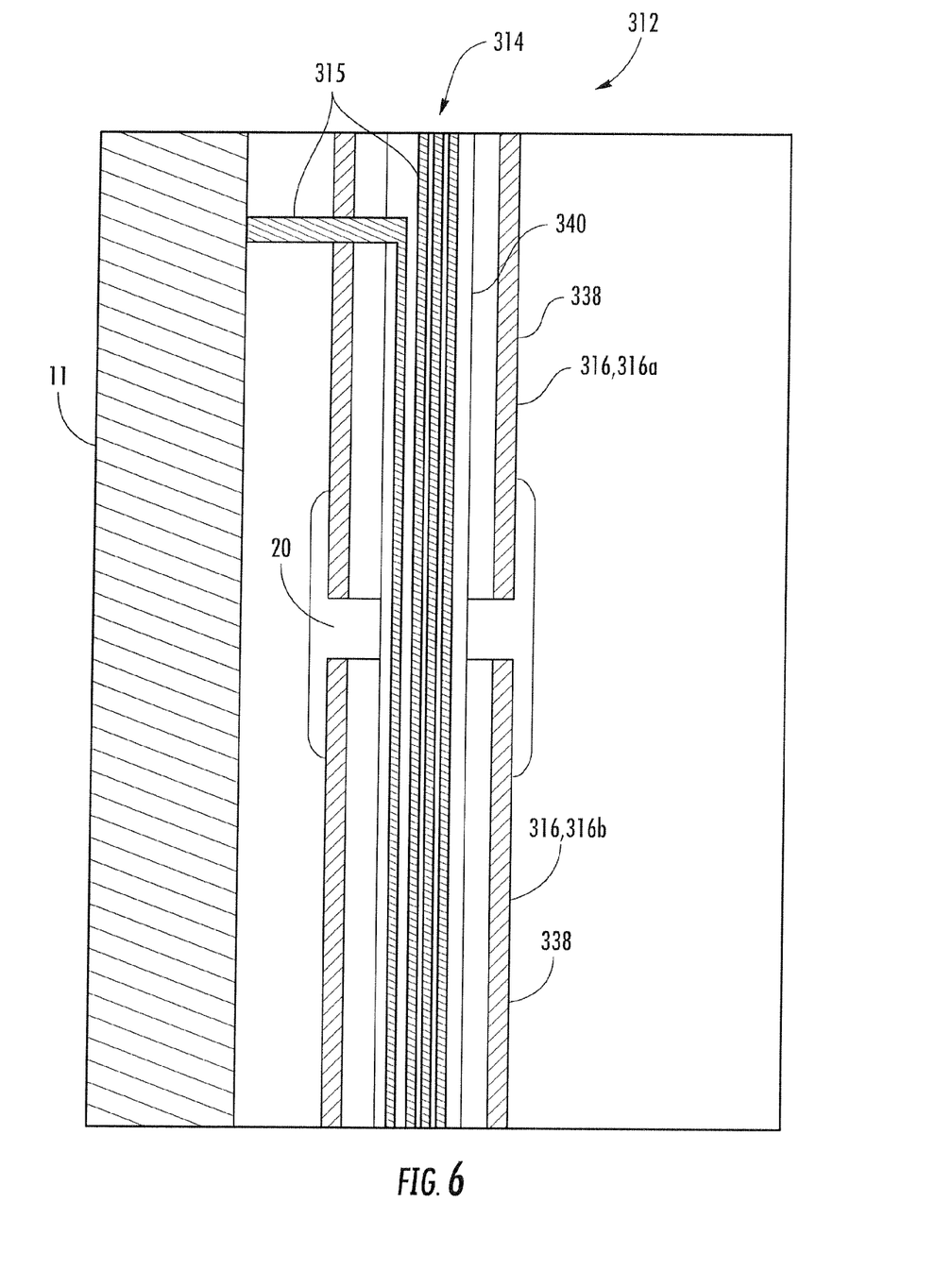
FIG. 6 shows an insulated conducting device with a continuous conductor encapsulated by segmented insulation system.

According to another embodiment, as shown in FIG. 6, insulated conductor device 312 includes a continuous conductor 314 and multiple insulation segments 316 (316a, 316b shown). Continuous conductor 314 may include multiple conductor cables 315, one of which may be connected to voltage structure 11. Insulation segments 316 interface with one another and collectively enclose continuous conductor 314. According to an embodiment, insulation segments 316 may include insulation pipes 338 of, e.g., Chlorinated Poly Vinyl Chloride (CPVC). Another insulation layer 340 of, e.g., pressurized air, SF6, syntactic silicone foam, or epoxy resin, may be positioned between continuous conductor 314 and insulation pipes 338.

According to another embodiment, the disclosure also includes a method for electrically shielding a voltage structure, e.g., voltage structure 11, by providing the insulated conducting devices of FIGS. 2 and 4-6, and coupling (positioning) the insulated conducting device to the voltage structure.

It is apparent that there have been provided with this disclosure structures of insulated conducting devices with insulation segments and related method of producing the same. While the disclosure has been particularly shown and described in conjunction with a preferred embodiment thereof, it will be appreciated that variations and modifications can be effected by a person of ordinary skill in the art without departing from the scope of the disclosure.

What is claimed is:

1. An insulated conducting device for a voltage structure, the insulated conducting device comprising:
   a conductor connected to a voltage; and
   multiple insulation segments enclosing the conductor, the multiple insulation segments interfacing with one another, wherein the conductor includes multiple conductor segments, each of which is enclosed by one of the multiple insulation segments, and wherein two immediate adjacent conductor segments are positioned in close proximity such that an equi-potential line of the two conductor segments are substantially similar to that of a continuous conductor.

2. The insulated conducting device of claim 1, wherein the voltage is different than a voltage of the voltage structure.

3. The insulated conducting device of claim 1, wherein the conductor includes one of a hollow metal pipe or a group of conductor cables.

4. The insulated conducting device of claim 3, wherein the group of conductor cables includes one connected to the voltage structure.

5. The insulated conducting device of claim 1, wherein each multiple conductor segment is connected separately to the voltage structure.

6. The insulated conducting device of claim 5, wherein an interface surface of an insulation segment is one of:
   substantially perpendicular to an adjacent surface of the insulation segment; or
   substantially sloped with respect to the adjacent surface.

7. The insulated conducting device of claim 6, wherein in the case the interface surface is substantially sloped, the interface surface overlaps an interface surface of an immediately adjacent insulation segment.

8. The insulated conducting device of claim 7, wherein an edge of a conductor segment enclosed in the insulation segment adjacent to the interface surface is substantially sloped.

9. The insulated conducting device of claim 6, wherein an edge of a conductor segment enclosed in the insulation segment is substantially rounded toward the interface surface.

10. The insulated conducting device of claim 5, wherein a conductor segment includes a group of conductor cables connected to a shielding conductor portion adjacent to an interface surface of a respective insulation segment enclosing the conductor segment, the shielding conductor portion extending toward the interface surface further than the group of conductor cables.

11. The insulated conducting device of claim 10, wherein a conductor cable is one of a substantially straight line or coiled.

12. The insulated conducting device of claim 11, wherein two conductor cables are at least one of transposed with respect to positions thereof and twisted together.

13. The insulated conducting device of claim 10, wherein in a cross-sectional view, the shielding conductor portion is one of:
   substantially U-shaped, with a connecting edge of the U-shape being substantially rounded toward the interface surface; or
   substantially H-shaped, with an opening of the H-shape facing the interface surface and an adjacent end of the H-shape substantially rounded toward the interface surface.

14. The insulated conducting device of claim 10, wherein the insulation segment includes a pipe-shaped portion coupled to a connection mold portion adjacent to the interface surface, the connection mold portion encapsulating a portion of the shielding conductor portion adjacent to the interface surface and being a substantially solid dielectric material.

15. The insulated conducting device of claim 14, wherein the pipe-shaped portion includes a Chlorinated Poly Vinyl Chloride (CPVC) pipe.

16. The insulated conducting device of claim 14, wherein the pipe-shaped portion includes multiple nested pipes, the multiple nested pipes dividing pipe-shaped portion into separate different cavities.

17. The insulated conducting device of claim 16, wherein the different cavities include different insulation materials.

18. The insulated conducting device of claim 1, wherein the conductor is a continuous conductor.

19. The insulated conducting device of claim 18, wherein the insulation segments include insulation pipes.

20. The insulated conducting device of claim 19, further comprising another insulation layer between the continuous conductor and the insulation pipes.

21. The insulated conducting device of claim 1, wherein an insulation segment includes multiple layers of different insulation materials.

22. A method of electrically shielding a voltage structure, the method comprising:
   providing multiple segments, each segment including a conductor encapsulated by a dielectric material;
   connecting each conductor to the voltage structure; and
   positioning the multiple segments such that two immediately adjacent conductors are in proximity such that an equi-potential line of the two immediately adjacent conductors is substantially similar to that of a continuous conductor.

* * * * *